United States Patent [19]
Gupta et al.

[11] Patent Number: 5,247,478
[45] Date of Patent: Sep. 21, 1993

[54] PROGRAMMABLE TRANSFER-DEVICES

[75] Inventors: Anil Gupta, San Jose; Richard G. Cliff, Santa Clara, both of Calif.

[73] Assignee: Altera Corporation, San Jose, Calif.

[21] Appl. No.: 846,915

[22] Filed: Mar. 6, 1992

[51] Int. Cl.[5] .......................................... G11C 11/40
[52] U.S. Cl. ............................. 365/185; 365/189.05; 365/230.06; 307/201; 307/469
[58] Field of Search .............. 365/185, 189.05, 230.06; 307/201, 468, 469

[56] References Cited

U.S. PATENT DOCUMENTS

| | | | |
|---|---|---|---|
| 4,885,719 | 12/1989 | Brahmbhatt | 365/185 |
| 4,935,648 | 6/1990 | Radjy et al. | 307/468 |
| 5,005,155 | 4/1991 | Radjy et al. | 365/185 |
| 5,016,217 | 5/1991 | Brahmbhatt | 365/185 |
| 5,021,693 | 6/1991 | Shima | 307/201 |
| 5,028,810 | 7/1991 | Castro et al. | 307/201 |
| 5,043,941 | 8/1991 | Sakamoto | 365/189.05 |
| 5,097,449 | 3/1992 | Cuevas | 365/185 |

OTHER PUBLICATIONS

Erich Goeting et al., "A CMOS Electrically-Reprogrammable ASIC with Multi-Level Random Logic Capabilities", *1986 IEEE International Solid-State Circuits Conference*, pp. 244-245 (1986).

Primary Examiner—Joseph E. Clawson, Jr.
Attorney, Agent, or Firm—Robert R. Jackson; Robert W. Morris

[57] ABSTRACT

A programmable, non-volatile transfer-device includes floating gate structures to control the transfer of signals from a set of inputs to a single output. Each floating gate structure includes two gates, logically coupled to each other in a master/slave mode, whereby the programming of the first gate controls the operation of the second gate. The floating gate structures are combined to implement a programmable multiplexer, without the use of static-RAM cells.

10 Claims, 3 Drawing Sheets

PROGRAMMABLE TRANSFER-DEVICES

BACKGROUND OF THE INVENTION

This invention relates to complementary metal oxide semiconductor ("CMOS") programmable logic devices, and more particularly, to the use of programmable logic devices as multiplexers.

Integrated circuit devices such as programmable logic arrays typically need large numbers of transfer-devices for such purposes as multiplexing various signals through a single output, circuit control, and data transfer. It is frequently desired for these devices to be programmable so that one integrated circuit can be made to satisfy many different needs. It may also be desired for these transfer-devices to be non-volatile (i.e., to retain the stored information even when the circuit is unpowered).

Heretofore, multiplexers have been implemented using N-channel transfer-devices which are controlled from volatile static-Random Access Memory ("RAM") cells. A static-RAM cell is used to program each individual N-channel transfer-device to allow or prohibit the transfer of data across the device. This implementation requires the use of static-RAM cells, and therefore a static-RAM array, thereby increasing the overall cost and complexity of the programmable logic device.

In view of the foregoing, it is an object of this invention to utilize a non-volatile floating gate structure in such a manner as to reduce or eliminate the need for static-RAM cells in a programmable logic device multiplexer.

SUMMARY OF THE INVENTION

This and other objects of the invention are accomplished in accordance with the principles of the invention by providing a floating gate structure whereby programming of a multiplexer can be accomplished without the use of static-RAM cells. The floating gate structure employs 2-T cell elements (comprising two EPROM or EPROM-type transistors labeled $T_1$ and $T_2$ with a common floating gate), whereby the two transistors are coupled to operate in the same manner. When transistor $T_1$ is in an unprogrammed state such that it can conduct, transistor $T_2$ can conduct. (In this condition transistors $T_1$ and $T_2$ are commonly said to be unprogrammed if they are EPROMs.) Conversely, if transistor $T_1$ is in a programmed state such that it cannot conduct, transistor $T_2$ cannot conduct. (In this condition transistors $T_1$ and $T_2$ are commonly said to be programmed if they are EPROMs.) Transistor $T_1$ is part of the memory array in the memory plane of the programmable logic device, and is typically programmed by momentarily applying a very high voltage to the word line and a high voltage to the bit line of the selected transistor. This causes a negative charge to be non-volatily stored on the floating gate of the transistor, thereby disabling the conduction path of the device during normal operation. Due to the common floating gate coupling between transistors $T_1$ and $T_2$, transistor $T_2$, which is located in the logic plane of the programmable logic array, is also programmed and no longer conducts, without needing to be exposed to high voltage levels. In this manner, programming of the transfer-device occurs without the use of static-RAM cells.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
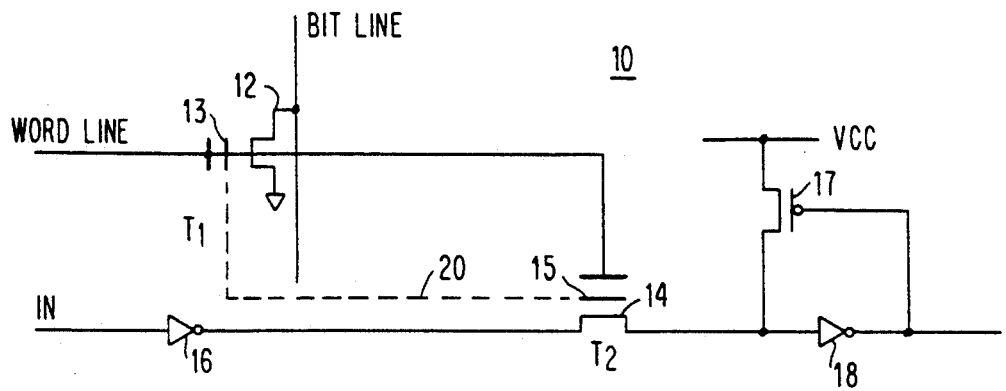
FIG. 1 is a schematic diagram of a first illustrative example of the floating gate structure.

In the illustrative example shown in FIG. 1, transfer-device 10 is representative of a floating gate structure comprising memory gate (transistor $T_1$) 12, logic gate (transistor $T_2$) 14, and coupling circuit (polysilicon) 20 that links the floating gates together. In the unprogrammed state, memory gate 12 conducts because there is no charge on floating gate 13, and via coupling circuit 20, there is also no charge on floating gate 15. Logic gate 14 therefore also conducts, which permits the signal IN to flow to OUT. Due to the voltage drop across logic gate 14, the signal at output of logic gate 14 would be below the required level for CMOS devices in the absence of a level-adjusting element like inverter 18. Inverter 18 and optional P-MOS transistor are used to implement the known technique of raising the output signal of logic gate 14 (which is greater than 2.5 volts, but less than 5 volts) to the proper CMOS logic level (i.e., where 5 volts equates to a logic 1). In order to program memory gate 12, WORD Line is momentarily set to a very high voltage such as 13 volts and BIT Line is also momentarily set to a high voltage such as 9 volts in the conventional way by conventional means (not shown). This causes a negative charge to build up on floating gate 13 which inhibits memory gate 12 from conducting at normal logic levels. Coupling circuit 20 causes a similar negative charge to build up on floating gate 15, thereby inhibiting logic gate 14 from conducting at normal logic levels. During normal functional operation, WORD Line is always set to 5 volts which enables logic gate 14 to conduct if floating gate 15 has not been programmed.

Figure 2:
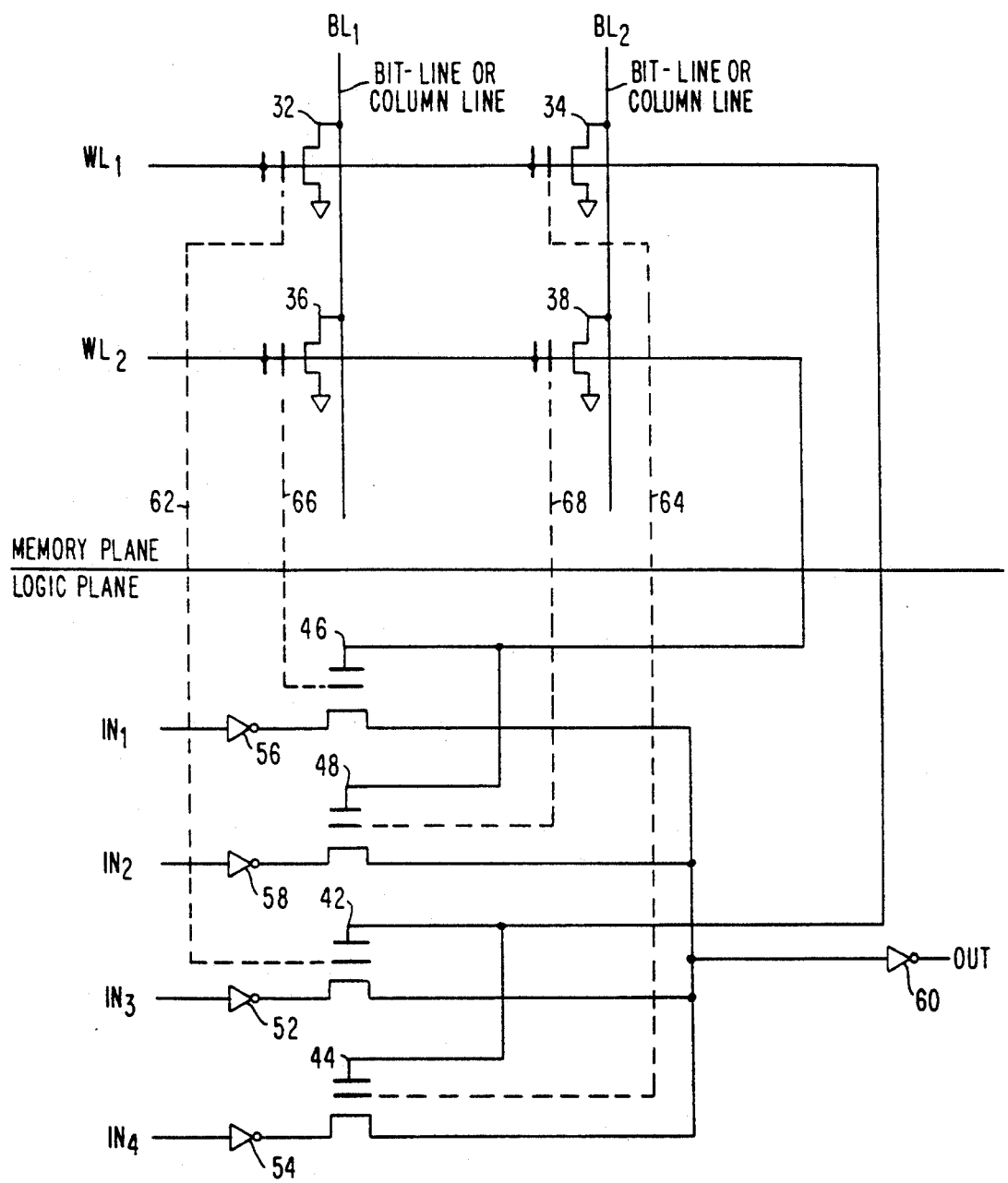
FIG. 2 is a schematic diagram of a first illustrative embodiment of the invention.

FIG. 2 shows an embodiment of the invention in the design of multiplexer 30. Multiplexer 30 is a 4-to-1 multiplexer whereby one of four input signals is selected to be output. The following example shows the operation of multiplexer 30 by describing the method of selecting signal $IN_4$ to be output to OUT. Initially, all four instances of transfer-device 10 are unprogrammed and therefore able to conduct.

To program multiplexer 30 to select $IN_4$ to be output to OUT, $WL_1$ (WORD Line 1) is momentarily set to a very high voltage such as 13 volts and $BL_1$ (BIT Line 1) is also momentarily set to a high voltage such as 9 volts. This causes memory gate 32 and logic gate 42 (via coupling circuit 62) to become nonconducting at normal logic levels (as described above), thereby preventing signal $IN_3$ from reaching OUT. The high voltages are then removed from $WL_1$ and $BL_1$. Next, $WL_2$ is momentarily set to a very high voltage such as 13 volts and $BL_1$ is also momentarily set to a high voltage such as 9 volts. This causes memory gate 36 and logic gate 46 (via coupling circuit 66) to become nonconducting at normal logic levels (as described above), thereby preventing signal IN₁ from reaching OUT. The same process is then performed using WL₂ and BL₂ to turn off memory gate 38 and logic gate 48, thereby preventing signal IN₂ from reaching OUT. Memory gate 34 and logic gate 44 are left unprogrammed. After the desired programming of multiplexer 30 has been completed, WL₁ and WL₂ are returned to logic 1 (i.e., 5 volts) and BL₁ and BL₂ are preferably returned to logic 0 (i.e., 0 volts). This applies logic 1 to the gates of logic gates 42, 44, 46, and 48, but only unprogrammed logic gate 44 is thereby rendered conducting. Therefore, only signal IN₄ is seen at OUT.

Figure 3:
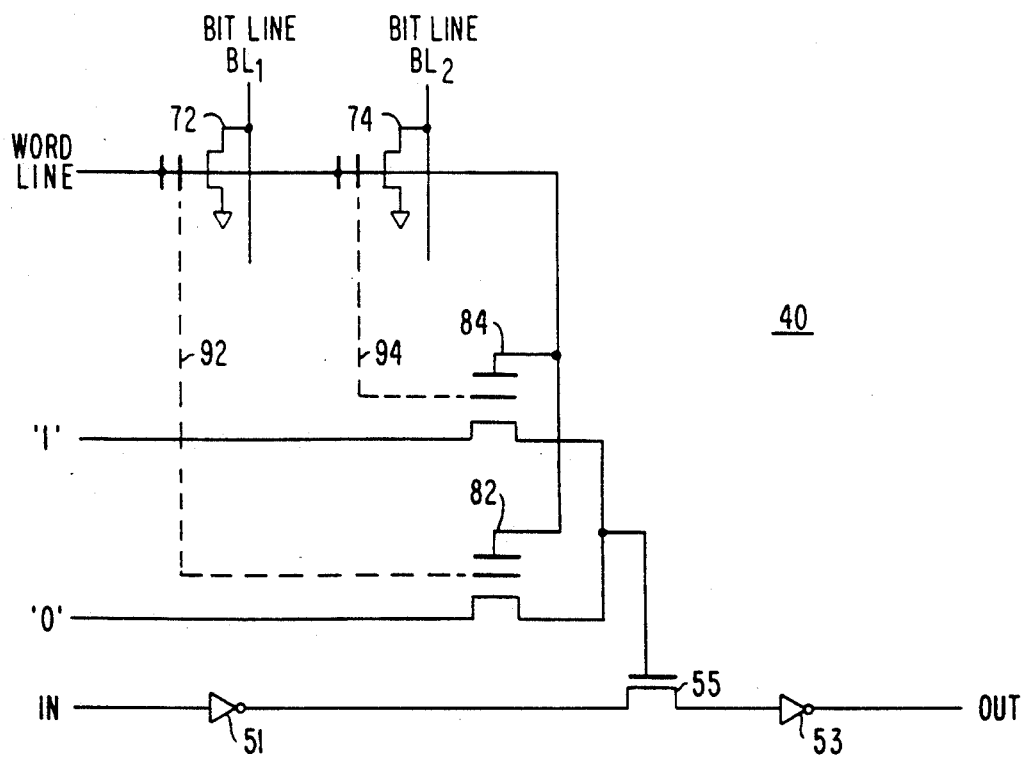
FIG. 3 is a schematic diagram of a second illustrative example of the floating gate structure.

FIG. 3 shows an alternative embodiment of wherein a transfer-device 40 is constructed using two instances of transfer-device 10, two inverters 51 and 53, and N-channel transistor 55. In the manner described above, memory gate 72 or 74 is programmed to be nonconducting at normal logic levels (as described above), thereby rendering logic gate 82 or 84, respectively, similarly nonconducting at normal logic levels (via coupling circuit 92 or 94, as described above). If memory gate 72 is programmed, a logic 1 will be conducted across logic gate 84 during normal operation, thereby enabling N-channel transistor 55 and permitting IN to flow to OUT. If memory gate 74 is programmed, a logic 0 will be conducted across logic gate 82, thereby inhibiting N-channel transistor 55 from conducting and prohibiting IN from flowing to OUT. The advantage of transfer-device 40 over transfer-device 10 is that transfer-device 40 transfers data at a higher speed, because N-channel transistor 55 has a higher gain than logic gate 14. In actual use, the increased performance of transfer-device 40 would be weighed against the increased cost of additional hardware required to implement transfer-device 40.

Figure 4:
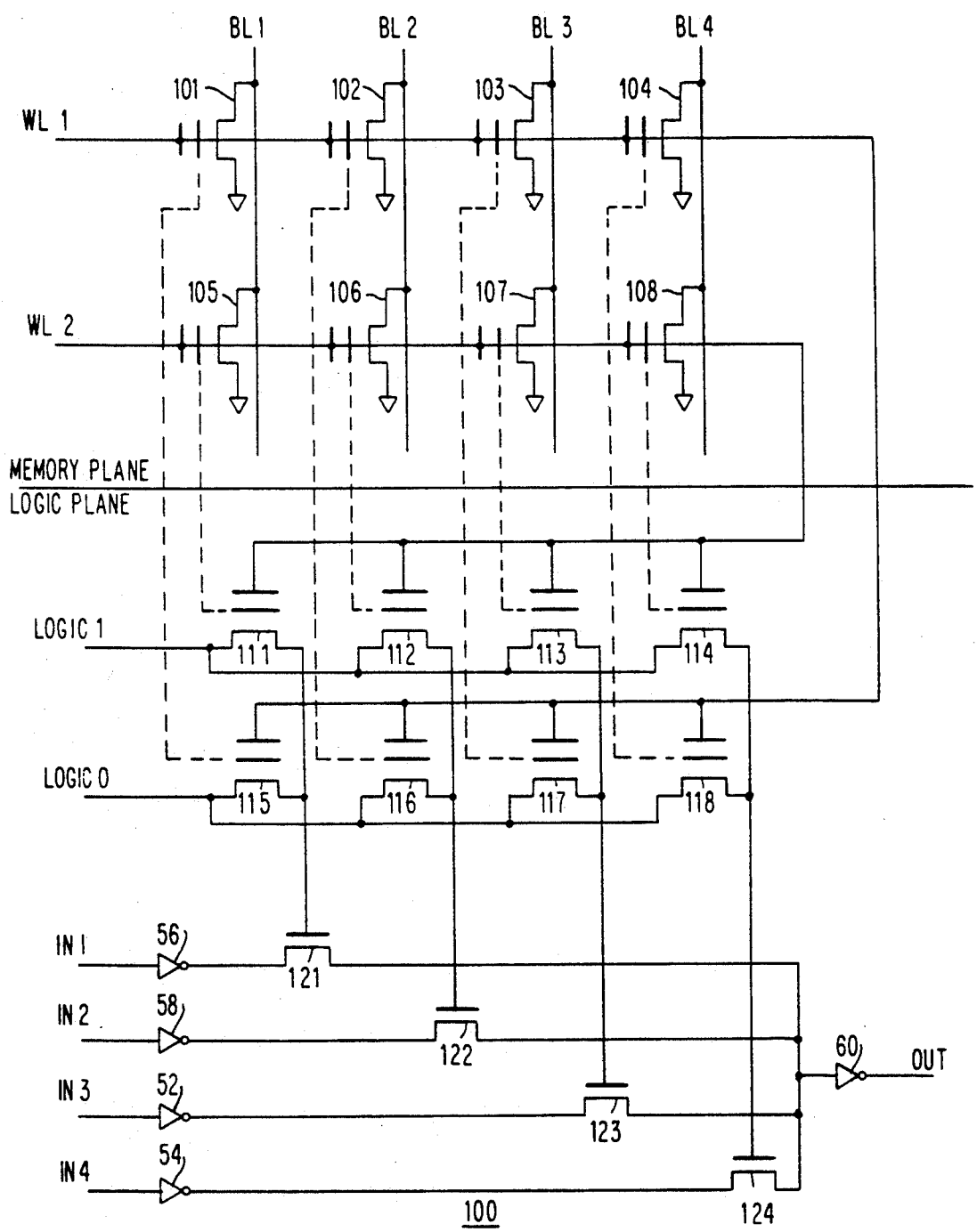
FIG. 4 is a schematic diagram of a second illustrative embodiment of the invention.

FIG. 4 shows an alternative embodiment of the invention in the design of multiplexer 100. Multiplexer 100 is also a 4-to-1 multiplexer, and is constructed by substituting transfer-device 40 in place of each instance of transfer-device 10 in FIG. 2. For example, memory gate 36 and logic gate 46 comprise an instance of transfer-device 10, which can be replaced with memory gates 101 and 105, logic gates 111 and 115, and N-channel transistor 121. Similar substitutions can be made by replacing memory gate 38 and logic gate 48 with memory gates 102 and 106, logic gates 112 and 116, and N-channel transistor 122; by replacing memory gate 32 and logic gate 42 with memory gates 103 and 107, logic gates 113 and 117, and N-channel transistor 123, and by replacing memory gate 34 and logic gate 44 with memory gates 104 and 108, logic gates 114 and 118, and N-channel transistor 124. By using the above substitutions, a higher performance multiplexer 100 can be designed, at a cost of additional hardware.

It will be understood that the foregoing is merely illustrative of the principles of this invention, and that various modifications can be made by those skilled in the art without departing from the scope and spirit of the invention. For example, using additional instances of transfer-device 10, multiplexer 30 can be designed to transfer any number of inputs to a single output. Additionally, any of several different types of programmable array devices (e.g., erasable programmable read only memory ("EPROM"), electrically erasable programmable read only memory ("EEPROM"), or low voltage erasable programmable read only memory ("FLASH")) can be used to implement the invention. In the appended claims the term EPROM is used generically to refer to all of these types of devices. With these other types of devices, programming steps could be different, but the principle of the invention is the same.

The invention claimed is:

1. An EPROM programmable logic device for transferring any desired one of a plurality of inputs to a single output comprising:
   a plurality of transfer-device elements, each element including a first EPROM transistor having an input, an output, a gate, and a floating gate, and a second EPROM transistor having an input, an output, a gate, and a floating gate, the floating gates of said first and second transistors being connected together;
   means for connecting each of said inputs of said logic device to the input of the second transistor of a respective one of said elements;
   means for connecting said output of the second transistor of each of said elements to the output of said programmable logic device;
   means for using the first transistor of each of said elements to determine an amount of charge stored on the floating gate of said first and second transistors of each of said elements so that the second transistors of all but one of said elements are rendered non-conducting despite the application of enabling signals to the gates of all of said second transistors; and
   means for applying enabling signals to the gates of all of said second transistors.

2. The apparatus defined in claim 1 wherein said means for using the first transistor of each of said elements comprises:
   a word line connected to said gate of said first transistor;
   a bit line connected to said input of said first transistor; and
   means for momentarily applying high voltages to said word line and said bit line.

3. The apparatus defined in claim i wherein said programmable logic device comprises:
   a memory plane containing each said first transistor of each said element; and
   a logic plane containing each said second transistor of each said element.

4. The apparatus defined in claim 1 wherein each of said first transistors is an EEPROM transistor.

5. The apparatus defined in claim 1 wherein each of said first transistors is a FLASH transistor.

6. An EPROM programmable logic device for transferring any desired one of a plurality of inputs to a single output comprising:
   a plurality of transfer-device elements, each element including first, second, third, and fourth EPROM transistors each having an input, an output, a gate, and a floating gate, the floating gates of said first and second EPROM transistors being connected together, and the floating gates of said third and fourth EPROM transistors being connected together, each of said elements also including an N-channel transistor having an input, an output, and a gate, the outputs of said second and fourth EPROM transistors being connected to the gate of said N-channel transistor;
   means for connecting each of said inputs of said programmable logic device to the input of the N-channel transistor of a respective one of said elements;

means for connecting said output of the N-channel transistor of each of said elements to the output of said programmable logic device;

means for applying a logic 1 signal to the inputs of all of said second EPROM transistors;

means for applying a logic 0 signal to the inputs of all of said fourth EPROM transistors; and means for using the first and third EPROM transistors of each of said elements to determine an amount of charge stored on the floating gates of said second and fourth EPROM transistors of each of said elements so that the fourth EPROM transistors of all but one of said elements are rendered conducting and so that the second EPROM transistor of all but said one of said elements is rendered non-conducting.

7. The apparatus defined in claim 6 wherein said means for using the first and third EPROM transistors in each of said elements comprises:

a word line connected to said gate of said first EPROM transistor and said third EPROM transistor;

a first bit line connected to said input of said first EPROM transistor;

a second bit line connected to said input of said third EPROM transistor; and means for momentarily applying high voltages to said word line and said bit line.

8. The apparatus defined in claim 6 wherein said programmable logic device comprises:

a memory plane containing said first EPROM transistor and said third EPROM transistor of each said element; and a logic plane containing said second EPROM transistor and said fourth EPROM transistor of each said element.

9. The apparatus defined in claim 6 wherein each of said first and third EPROM transistors is an EEPROM transistor.

10. The apparatus defined in claim 6 wherein each of said first and third EPROM transistors is a FLASH transistor.

* * * * *